US011521992B2

(12) United States Patent
Jia et al.

(10) Patent No.: US 11,521,992 B2
(45) Date of Patent: Dec. 6, 2022

(54) METHOD FOR MANUFACTURING ARRAY SUBSTRATE, INTERMEDIATE ARRAY SUBSTRATE PRODUCT, AND ARRAY SUBSTRATE (71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yukun Jia, Beijing (CN); Niannian Wang, Beijing (CN); Miao Wang, Beijing (CN); Dalin Fan, Beijing (CN); Fan Yang, Beijing (CN); Ge Zhang, Beijing (CN); Zongrui Feng, Beijing (CN)

(73) Assignees: CHONGQING BOE OPTOELECTRONICS TECHNOLOGY CO., LTD., Chongqing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 907 days.

(21) Appl. No.: 16/316,615

(22) PCT Filed: May 10, 2018

(86) PCT No.: PCT/CN2018/086278
§ 371 (c)(1),
(2) Date: Jan. 9, 2019

(87) PCT Pub. No.: WO2019/041880
PCT Pub. Date: Mar. 7, 2019

(65) Prior Publication Data
US 2021/0366946 A1 Nov. 25, 2021

(30) Foreign Application Priority Data

Aug. 29, 2017 (CN) .......................... 201710756891.7

(51) Int. Cl.
H01L 27/12 (2006.01)
(52) U.S. Cl.
CPC ...... *H01L 27/1244* (2013.01); *H01L 27/1259* (2013.01)
(58) Field of Classification Search
CPC ... H01L 27/1244; H01L 23/62; H01L 21/485; H01L 21/76868; G02F 1/136259–136263; G02F 1/1309
See application file for complete search history.

(56) References Cited

U.S. PATENT DOCUMENTS 9,678,399 B2   6/2017  Hua et al.
2007/0096768 A1  5/2007  Li
(Continued)

FOREIGN PATENT DOCUMENTS

CN   104916650 A   9/2015
CN   104965325 A   10/2015
(Continued)

OTHER PUBLICATIONS

International Search Report and Written Opinion dated Jul. 20, 2018 in PCT/CN2018/086278.
(Continued)

Primary Examiner — Amar Movva
(74) Attorney, Agent, or Firm — Syncoda LLC; Feng Ma (57) ABSTRACT An array substrate manufacturing method includes forming a plurality of first lead lines, a plurality of pixel electrodes, and a plurality of connecting lines over a substrate. Each first lead line is insulated from any pixel electrode, and each connecting line is insulated from any first lead line and is configured to electrically couple at least two pixel electrodes
(Continued)

such that a set of pixel electrodes electrically coupled by each set of connecting lines substantially form an equivalent lead line. The method further includes detecting whether there is a short circuit between one equivalent lead line and a first lead line, and severing each of the plurality of connecting lines such that any two of the plurality of pixel electrodes are not electrically coupled.

7 Claims, 8 Drawing Sheets

(56) References Cited

U.S. PATENT DOCUMENTS

2010/0051958 A1* 3/2010 Izumida .............. H01L 51/5228
257/72
2017/0038652 A1* 2/2017 Hua .................. G02F 1/136286

FOREIGN PATENT DOCUMENTS

| JP | S5888787 A | 5/1983 |
| JP | H06313877 A | 11/1994 |
| JP | 2011237671 A | 11/2011 |

OTHER PUBLICATIONS

India First Office Action in Application No. 201837044781, dated Jan. 5, 2021.
Japan first office action in Application No. 2018-563828, dated Apr. 12, 2022.

* cited by examiner

METHOD FOR MANUFACTURING ARRAY SUBSTRATE, INTERMEDIATE ARRAY SUBSTRATE PRODUCT, AND ARRAY SUBSTRATE

CROSS-REFERENCE TO RELATED APPLICATION

The present application claims priority to Chinese Patent Application No. 201710756891.7 filed on Aug. 29, 2017, the disclosure of which is hereby incorporated by reference in its entirety.

TECHNICAL FIELD

The present disclosure relates generally to the field of array substrate manufacturing and testing, and more specifically to a method for manufacturing an array substrate, an intermediate array substrate product during the manufacturing of the array substrate, and an array substrate manufactured thereby.

BACKGROUND

An array substrate with an advanced super dimension switch (ADS) mode or an HADS mode is typically provided with both a common electrode (e.g. a common ITO) and a plurality of pixel electrodes (e.g. PXL ITO), which are usually stacked over one another over a substrate, and are typically separated by an insulating layer.

In an array substrate with an ADS or HADS display mode, each storage capacitor (CST) and each liquid crystal capacitor (CLC) are also typically realized through two electrodes. According to existing display technologies, in order to increase the aperture ratio of the pixels in the array substrate and in the display panel having the array substrate, typically the pixel electrodes are configured independently.

SUMMARY

In a first aspect, a method for manufacturing an array substrate is provided in the present disclosure. The method comprises the following steps:

forming a plurality of first lead lines, a plurality of pixel electrodes and a plurality of connecting lines over a substrate, wherein each first lead line is insulated from any pixel electrode, and each connecting line is insulated from any first lead line and is configured to electrically couple at least two pixel electrodes such that a set of pixel electrodes electrically coupled by each set of connecting lines substantially form an equivalent lead line;

detecting whether there is a short circuit between one equivalent lead line and a first lead line; and severing each of the plurality of connecting lines such that any two of the plurality of pixel electrodes are not electrically coupled.

After the step of detecting whether there is a short circuit between one equivalent lead line and a first lead line, the method can further comprise a step of determining, if a short circuit is detected between an equivalent lead line and a first lead line, a position of a pixel electrode in the one equivalent lead line having a short circuited portion with the first lead line.

After the step of determining, if a short circuit is detected between an equivalent lead line and a first lead line, a position of a pixel electrode in the one equivalent lead line having a short circuited portion with the first lead line, the method can further comprise a step of severing the short circuited portion. Herein, the step of severing the short circuited portion can be at a substantially same step as the step of severing each of the plurality of connecting lines.

In the method described above, in the step of forming a plurality of first lead lines, a plurality of pixel electrodes and a plurality of connecting lines over a substrate, it can be configured such that no insulating layer is arranged between the plurality of first lead lines and the plurality of pixel electrodes, and an orthographic projection of the plurality of first lead lines on the substrate is not overlapped with an orthographic projection of the plurality of pixel electrodes on the substrate.

In the embodiments of the method as described above, each of the plurality of first lead lines can be one of a data line or a gate line. Furthermore, in the step of forming a plurality of first lead lines, a plurality of pixel electrodes and a plurality of connecting lines over a substrate, each connecting line can be configured to electrically couple two adjacent pixel electrodes, the plurality of connecting lines and the plurality of first lead lines can be formed in a substantially same step, and/or the plurality of connecting lines and the plurality of pixel electrodes are formed in a substantially same step.

After the step of forming a plurality of first lead lines, a plurality of pixel electrodes and a plurality of connecting lines over a substrate and before the step of severing each of the plurality of connecting lines such that any two of the plurality of pixel electrodes are not electrically coupled, the method can further include:

forming a first insulating layer having a plurality of first vias over the plurality of first lead lines, the plurality of pixel electrodes and the plurality of connecting lines, such that each first via positionally corresponds to, and exposes, each connecting line; and forming a common electrode having a plurality of openings over the first insulating layer, such that the plurality of openings positionally correspond to the plurality of first vias in the first insulating layer respectively.

Herein, the first insulating layer can be a gate insulating layer or a passivation layer.

In the embodiments of the method as described above, the step of severing each of the plurality of connecting lines can be performed by etching through the plurality of openings in the common electrode and through the plurality of first vias in the first insulating layer.

In the step of forming a plurality of first lead lines, a plurality of pixel electrodes and a plurality of connecting lines over a substrate of the method, it can be configured such that at least one end of each equivalent lead line is arranged at an edge of the array substrate, and the step of detecting whether there is a short circuit between one equivalent lead line and a first lead line is performed by means of the at least one end of each equivalent lead line arranged at an edge of the array substrate.

In a second aspect, the present disclosure further comprises an intermediate product of an array substrate during a manufacturing process, which includes a substrate, and a plurality of first lead lines, a plurality of pixel electrodes, and a plurality of connecting lines, over the substrate. It is configured such that each first lead line is insulated from any pixel electrode, each connecting line is insulated from any first lead line, and each connecting line is configured to electrically couple at least two pixel electrodes such that a set of pixel electrodes electrically coupled by each set of connecting lines substantially form an equivalent lead line.

In the intermediate product as described above, it can be further configured such that there is no insulating layer between the plurality of first lead lines and the plurality of pixel electrodes, and that an orthographic projection of the plurality of first lead lines on the substrate is not overlapped with an orthographic projection of the plurality of pixel electrodes on the substrate.

Herein, at least one end of each equivalent lead line can be arranged at an edge of the array substrate.

Furthermore, each of the plurality of first lead lines can be one of a data line or a gate line, and additionally each connecting line can be configured to electrically couple two adjacent pixel electrodes.

The intermediate product can further include a first insulating layer over the plurality of first lead lines, the plurality of pixel electrodes and the plurality of connecting lines, and a common electrode over the first insulating layer. The first insulating layer is provided with a plurality of first vias, each configured to positionally correspond to, and to expose, each of the plurality of connecting lines. The common electrode is provided with a plurality of openings, configured to positionally correspond to the plurality of first vias in the first insulating layer respectively.

In a third aspect, the present disclosure further provides an array substrate. The array substrate includes a substrate, and over the substrate, a plurality of first lead lines, a plurality of pixel electrodes, and a plurality of connecting lines.

In the array substrate, each first lead line is insulated from any pixel electrode, each connecting line is insulated from any first lead line, each connecting line is configured to electrically couple at least two pixel electrodes such that a set of pixel electrodes electrically coupled by each set of connecting lines substantially form an equivalent lead line, no insulating layer is arranged between the plurality of first lead lines and the plurality of pixel electrodes, and an orthographic projection of the plurality of first lead lines on the substrate is not overlapped with an orthographic projection of the plurality of pixel electrodes on the substrate.

Other embodiments may become apparent in view of the following descriptions and the attached drawings.

DETAILED DESCRIPTION

In the following, with reference to the drawings of various embodiments disclosed herein, the technical solutions of the embodiments of the disclosure will be described in a clear and fully understandable way.

It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Throughout the disclosure, the phrase "at a substantially same layer" is referred to as a situation where any two structures of interest are substantially derived from a same material layer, and are thus at a same layer in terms of the positional relationship. It is noted that two structures at a substantially same layer do not necessarily mean that they have an equal distance to the substrate, or that the layers between each of the two structures and the substrate are the same.

In a typical array substrate with an ADS or HADS display mode according to current display technologies, in order to increase the aperture ratio of the pixels in the array substrate and in the display panel having the array substrate, typically a common electrode and a plurality of pixel electrodes are usually stacked over one another over a substrate, and are typically separated by an insulating layer. Yet such a design and a configuration of the array substrate often result in the occurrence of a remain of pixel electrode, a significant disadvantage that is illustrated in FIG. 1 and described in the following.

Figure 1:
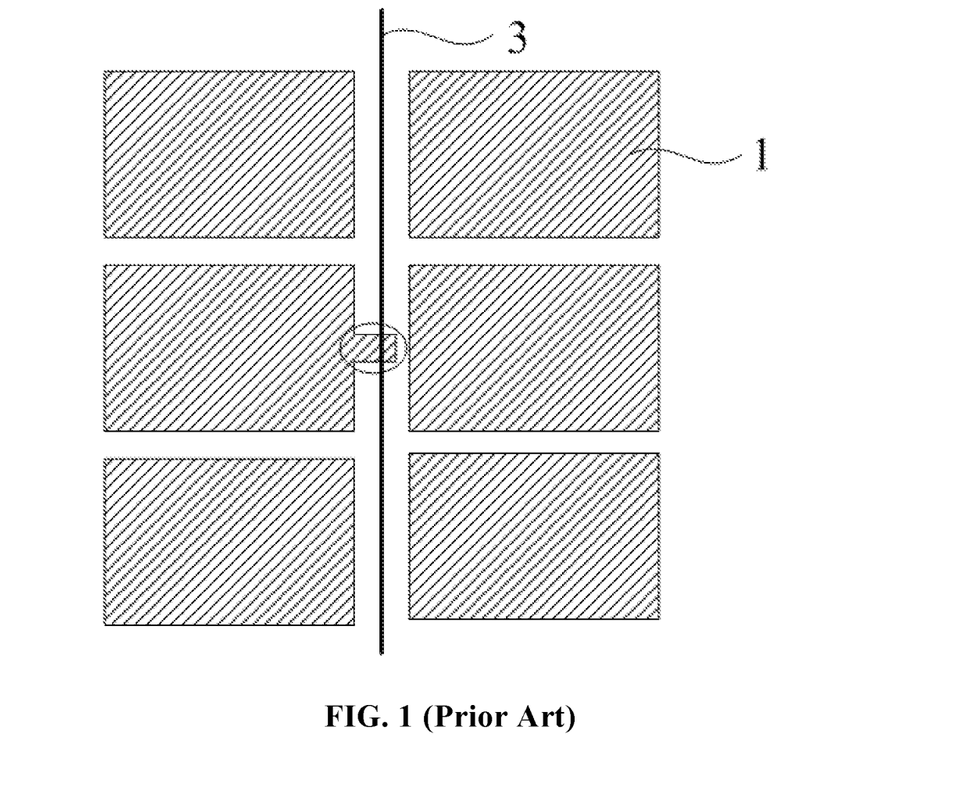
FIG. 1 illustrates an array substrate having a defect of a remain of pixel electrode which is manufactured by a conventional manufacturing process according to an existing technology.

FIG. 1 illustrates an array substrate according to an existing technology in the field. In this conventional array substrate as shown in the figure, the plurality of pixel electrodes 1 are separately arranged, and it is configured such that there is no insulating layer arranged between the layer of the plurality of pixel electrodes 1 and the layer of a plurality of lead lines (for example, a plurality of data lines 3 as illustrated in FIG. 1, but can be a plurality of gate lines or a plurality of separately arranged conductive lines, which are not shown in the drawings).

As such, the plurality of pixel electrodes 1 and the plurality of lead lines (i.e. data lines, gate lines, or separately arranged conductive lines, etc.) can be arranged in a substantially same layer of the array substrate, yet at different positions to thereby avoid the electrical conduction between the plurality of pixel electrodes 1 and the plurality of lead lines.

Due to technical limitations in the current manufacturing process of an array substrate in the field, however, there can be a defect of the array substrate, specifically a remain of pixel electrode (also known as "PXL ITO remain" in the field), where a pattern of pixel electrodes is overlapped with a lead line (as illustrated by the encircled region in FIG. 1).

Because of the presence of the remains of pixel electrodes in the array substrate, an unwanted electrical connection, or short circuits, can occur between one pixel electrode that is present with a remain of pixel electrode and a lead line that is supposed to be insulated from, but is nonetheless short circuited with, the one pixel electrode. This consequently results in a defective array substrate.

In the display panel having such a defective array substrate as mentioned above, these unwanted electrical connections between pixel electrodes and lead lines (i.e. data lines or gate lines, or separate conductive lines) can in turn result in the appearance of bright dots or dark dots during display of the display panel, which can negatively influence the display effect of the display panel.

The above mentioned defect of the array substrate (i.e. remains of pixel electrodes) as mentioned above need to be fixed in order to ensure a display effect and a good quality of the display panel.

In current array substrate manufacturing and testing technologies, however, the testing of the array substrate, also known as "array test", can only detect whether there are any short circuits or broken circuits in lead lines (e.g. data lines, gate lines, common electrode lines, etc.), whereas the electrical connections between the pattern of pixel electrodes and lead lines, such as in a remain of pixel electrode, typically do not cause short circuits or broken circuits in these lead lines, and thus cannot be detected as a result.

Consequently, the aforementioned defects of an array substrate (i.e. remains of pixel electrodes) typically cannot be intercepted during a manufacturing and testing process of the array substrate, and can only be detected in a subsequent display panel lighting test, whereas at this stage, an accurate localization of these defects of remains of pixel electrodes in the array substrate, and an effective repair thereof as well, can be quite difficult. These technical limitations have resulted in reduced product quality and poor qualification rate for the display panel.

In order to address the issue as described above, the present disclosure provides a method for manufacturing an array substrate and an intermediate array substrate product during the manufacturing of the array substrate.

In a first aspect, a method for manufacturing an array substrate is disclosed.

Figure 2:
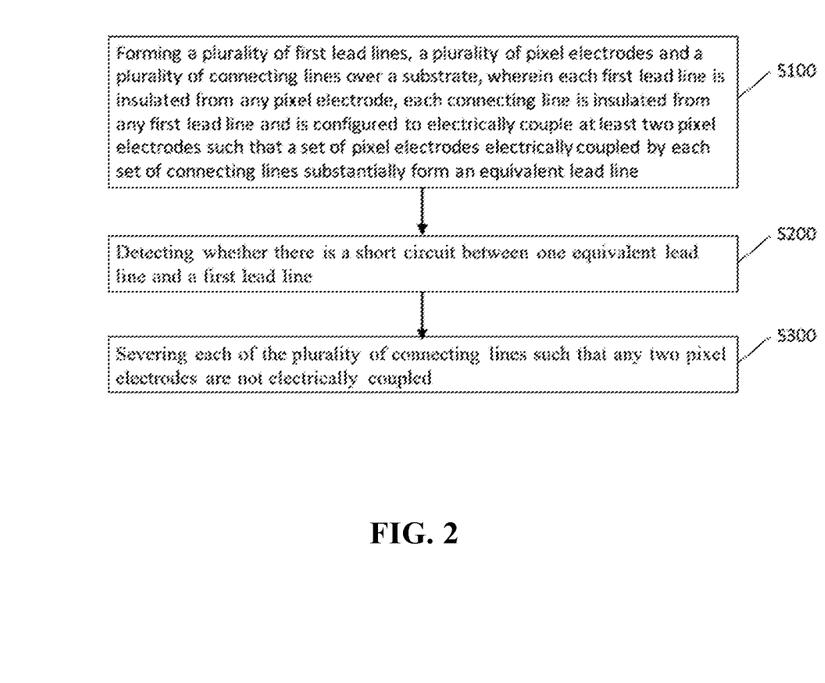
FIG. 2 shows a flow chart of a method for manufacturing an array substrate according to some embodiments of the disclosure.

As shown by the flow chart illustrated in FIG. 2, the method for manufacturing an array substrate according to some embodiments of the disclosure comprises the following steps:

S100: Forming a plurality of first lead lines, a plurality of pixel electrodes and a plurality of connecting lines over a substrate, wherein each first lead line is insulated from any pixel electrode, each connecting line is insulated from any first lead line and is configured to electrically couple at least two pixel electrodes such that a set of pixel electrodes electrically coupled by each set of connecting lines substantially form an equivalent lead line;

S200: Detecting whether there is a short circuit between one equivalent lead line and a first lead line; and S300: Severing each of the plurality of connecting lines such that any two of the plurality of pixel electrodes are not electrically coupled.

Herein, the step S100 substantially allows a formation of an intermediate product of the array substrate, which comprises the plurality of first lead lines, the plurality of pixel electrodes and the plurality of connecting lines over the substrate. The intermediate product is configured such that each first lead line is insulated from any pixel electrode, each connecting line is insulated from any first lead line, and each connecting line is configured to electrically couple at least two pixel electrodes such that a set of pixel electrodes electrically coupled by each set of connecting lines substantially form an equivalent lead line.

In the step S100, it can be further configured such that there is no insulating layer between the plurality of first lead lines and the plurality of pixel electrodes, and an orthographic projection of the plurality of first lead lines on the substrate is not overlapped with an orthographic projection of the plurality of pixel electrodes on the substrate. This is substantially the ADS or HADS mode of the array substrate being manufactured.

In the step S100, it can be further configured such that at least one end of each equivalent lead line is arranged at an edge of the array substrate. The presence of the at least one end of each equivalent lead line at an edge of the array substrate facilitates the detection of a remain of pixel electrode as laid out in step S200.

Herein, each of the plurality of first lead lines can be a data line, a gate line, or a conductive line. In embodiments where each first lead line is a data line or a gate line, each connecting line can be configured to electrically couple two adjacent pixel electrodes. As such, in an array substrate where the plurality of pixel electrodes are arranged in a matrix having rows or columns, each connecting line can be configured to electrically couple two adjacent pixel electrodes, and each equivalent lead line is substantially the set of pixel electrodes in a same row or in a same column.

It is further noted that in the step of forming a plurality of first lead lines, a plurality of pixel electrodes and a plurality of connecting lines over a substrate (i.e. step S100), the plurality of connecting lines and the plurality of first lead lines can be at a substantially same layer, and thus can be formed in a substantially same step (i.e. formed simultaneously). For example, the plurality of connecting lines can be formed at a substantially same manufacturing step of a plurality of data lines (or gate lines) and thus they are at a substantially same metal layer as the plurality of data lines (or gate lines).

Alternatively, in the step S100. the plurality of connecting lines and the plurality of pixel electrodes can be at a substantially same layer, and thus can be formed in a substantially same step (i.e. formed simultaneously). For example, the plurality of connecting lines can be formed at a substantially same manufacturing step of a plurality of pixel electrodes and thus they are at a substantially same ITO layer as the plurality of pixel electrodes.

In the above mentioned method for manufacturing an array substrate, a plurality of connecting lines are first utilized to temporarily electrically connect pixel electrodes to thereby form a conductive line equivalent to a lead line (termed "equivalent lead line" hereafter). If there is a remain of pixel electrode to cause electrical connection between a pixel electrode and a first lead line, it is equivalent to a short circuit between an equivalent lead line and a first lead line.

After the detection of whether there is a short circuit between one equivalent lead line and a first lead line (i.e. the step S200), the manufacturing method can include an additional step of determining, if a short circuit is detected between an equivalent lead line and a first lead line, a position of a pixel electrode in the one equivalent lead line having a short circuited portion with the first lead line.

After the position of the pixel electrode in the one equivalent lead line having a short circuited portion with the first lead line is determined, the short circuited portion can be severed (or cut off) for the repair of the remain of pixel electrode in the array substrate. Herein a laser cuffing can be utilized for the severing or cuffing off of the short circuited portion of the pixel electrode where the remain of pixel electrode occurs.

It is noted that the determination of the position of the pixel electrode in the one equivalent lead line having a short circuited portion with the first lead line and the repair thereof can either or both be performed during the manufacturing process of the array substrate, or can be performed later on.

In a testing of the array substrate (i.e. the array test) during the manufacturing process, a short circuit between an equivalent lead line and a first lead line can be detected and repaired, as such the defect (i.e. the remains of pixel electrodes) can be intercepted and therefore does not enter into a subsequent manufacturing process, in turn leading to an improved product quality and an increased qualification rate for a display panel having the array substrate.

After the testing is complete, the plurality of connecting lines can be removed such that the plurality of pixel electrodes are not electrically connected between one another, and an array substrate product with normal functions can be obtained.

According to some embodiments, such as in a typically ADS/HADS-mode array substrate, the array substrate further comprises a first insulating layer (e.g. a gate insulating layer or a passivation layer) over the plurality of first lead lines, the plurality of pixel electrodes and the plurality of connecting lines, and a common electrode over the first insulating layer.

In these embodiments, in order to facilitate the severing or removal of each of the plurality of connecting lines in the step S300, the manufacturing method disclosed herein can involve the formation of an intermediate product, configured such that the first insulating layer is provided with a plurality of first vias, each configured to positionally correspond to, and to expose, each of the plurality of connecting lines, and the common electrode is provided with a plurality of openings, configured to positionally correspond to the plurality of first vias in the first insulating layer respectively.

Herein and throughout the disclosure, the term "positionally correspond" or alike is referred to a situation where the orthographic projections of two different structures on the substrate are overlapped with one another.

By the above configuration of the intermediate product, the plurality of openings in the common electrode and the plurality of first vias in the first insulating layer substantially provides a convenience for the removal of each connecting lines by etching.

Yet according to some other embodiments of the disclosure, the removal of each connecting lines in the step S300 can be performed by laser cutting.

FIGS. 2-9 illustrate an array substrate being manufactured by a method for manufacturing an array substrate according to some specific embodiments of the disclosure.

S21: Forming a plurality of pixel electrodes 1 over the substrate 9.

Specifically, the step S21 comprises: forming a pixel electrode 1 in each of a plurality of pixel units, wherein the pixel electrode 1 is electrically coupled to a drain electrode of a driving thin-film transistor (TFT), and is configured to provide a data voltage to the driving thin-film transistor (TFT).

Herein, each of the plurality of pixel electrodes 1 can take a different type. For example, each pixel electrode 1 can be a slit electrode if it is above a common electrode 2 (i.e. each pixel electrode 1 is over the common electrode 2, and the common electrode 2 is over the substrate 9), or can be a plate electrode if it is underneath the common electrode 2 (i.e. each pixel electrode 1 is between the substrate 9 and the common electrode 2) or there is no common electrode in the array substrate. The different types of pixel electrodes are known to those of ordinary skills in the field, and the technical descriptions thereof are skipped herein.

S22: Forming a plurality of first lead lines over the substrate 9, wherein an orthographic projection of the plurality of first lead lines on the substrate is not overlapped with an orthographic projection of the plurality of pixel electrodes on the substrate, and there is no insulating layer arranged between a layer of the plurality of first lead lines and a layer of the plurality of pixel electrodes.

In other words, in the manufacturing method, after forming the plurality of pixel electrodes 1, the plurality of first lead lines can be formed without arranging any insulating layer between the layer of the plurality of first lead lines and the layer of the plurality of pixel electrodes.

Because the plurality of first lead lines and the plurality of pixel electrodes 1 are arranged at different positions over the substrate 9 (i.e. their respective orthographic projection on the substrate 9 are not overlapped), each of the plurality of first lead lines and each of the plurality of pixel electrodes 1 are not in contact with one another. However, if there is a remain of a pixel electrode, because there is no insulating layer arranged between a layer of the plurality of first lead lines and a layer of the plurality of pixel electrodes, the pixel electrode 1 can form an electrical conduction (i.e. substantially a short circuit) with one of the plurality of first lead lines (as illustrated by the circled region in any of the figures).

Figure 3:
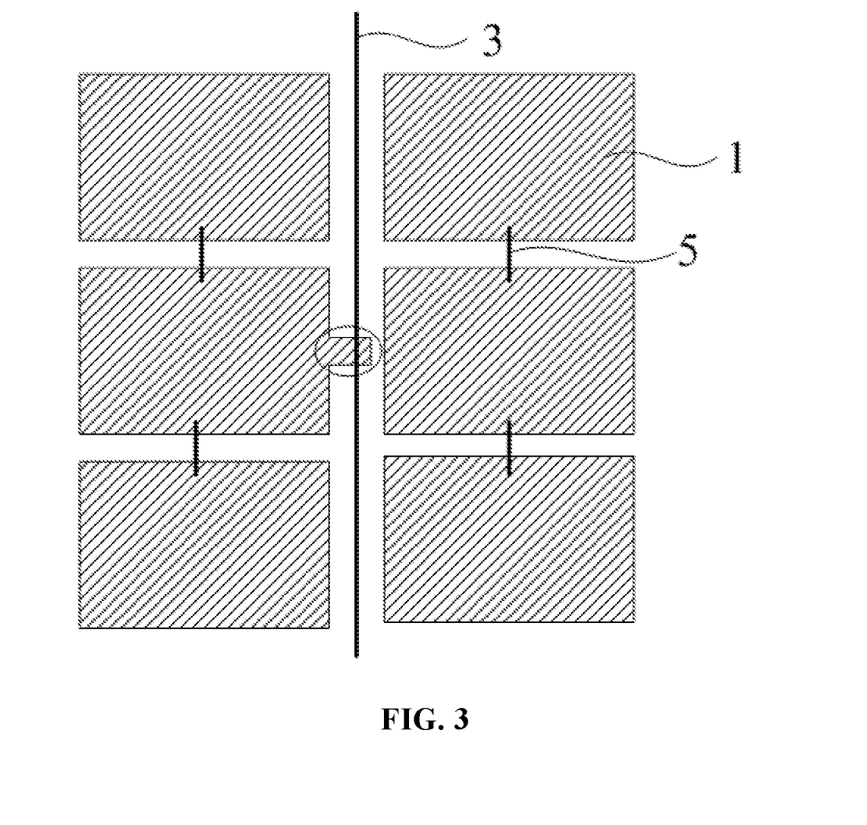
FIG. 3 illustrates an array substrate having a defect of a remain of pixel electrode which is being manufactured by a manufacturing method according to some embodiments of the disclosure.
Figure 4:
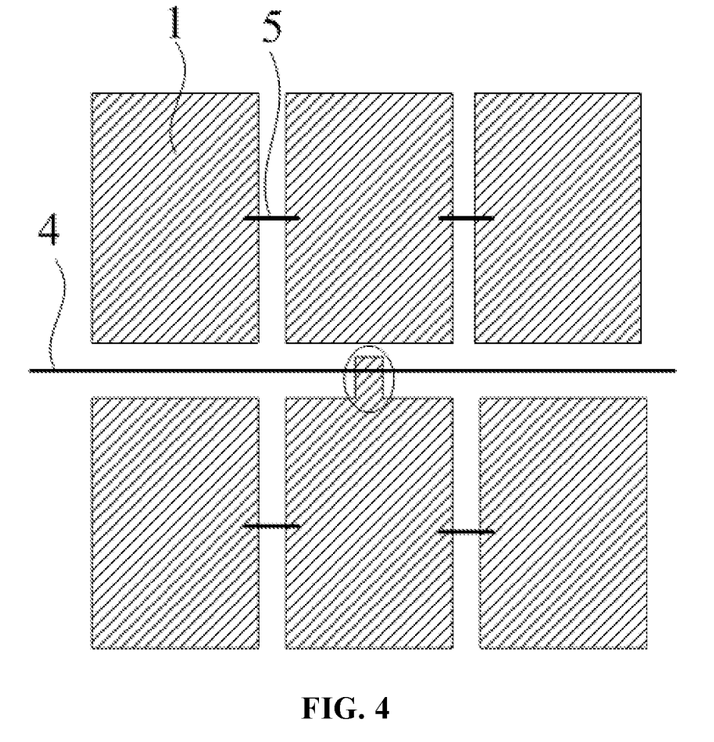
FIG. 4 illustrates an array substrate having a defect of a remain of pixel electrode which is being manufactured by a manufacturing method according to some other embodiments of the disclosure.

Each of the plurality of first lead lines optionally can be a gate line 4, or optionally can a data line 3. In other words, depending on the different structure of the array substrate product, each of the plurality of lead lines that is arranged between pixel electrodes 1 with no insulating layer arranged therebetween the plurality of lead lines and the plurality of pixel electrodes 1 can be a data line 3 (as illustrated in FIG. 3) or can be a gate line 4 (as illustrated in FIG. 4).

In an array substrate during implementation, a plurality of data lines 3 and a plurality of gate lines are typically arranged to be staggered from one another and are separated from one another via an insulating layer. Yet for conciseness and clarity in illustrations of the positional relationship between the plurality of first lead lines and the plurality of pixel electrodes, only one of a data line 3 or a gate line 4 is illustrated in each figure of the drawings.

It is noted that besides the above two embodiments (i.e. each first lead line is a data line 3 or a gate line 4), each of the plurality of first lead lines can be a common electrode line, or can be an additionally arranged electrical wiring/conductive line, as long as it is configured to be positionally separated from the plurality of pixel electrodes 1 (i.e. their respective orthographic projections on the substrate do not overlap) and there is no insulating layer arranged the layer of plurality of pixel electrodes 1 and the layer of the plurality of common electrode lines/conductive lines/electrical wirings/etc.

It is noted that although in the embodiments as described above, the plurality of pixel electrodes 1 are formed before the plurality of first lead lines, according to some other embodiments of the present disclosure, the plurality of first lead lines can be formed before the plurality of pixel electrodes 1. In these latter embodiments, therefore, the remain of a pixel electrode actually covers a first lead line to form an electrical connection (i.e. a short circuit) between one of the plurality of first lead lines and one of the plurality of pixel electrodes at the position for the remain of the pixel electrode.

S23: Forming a plurality of connecting lines, such that each of the plurality of connecting lines is insulated from any one of the plurality of first lead lines, and electrically connects at least two of the plurality of pixel electrodes 1, wherein a set of pixel electrodes electrically connected by a set of connecting line substantially form an equivalent lead line (i.e. a conductive line that is equivalent to a lead line), and at least one end of each equivalent lead line is positioned at an edge of the array substrate.

As illustrated FIG. 3, a plurality of connecting lines 5 are formed temporarily to electrically connect a set of pixel electrodes 1 to thereby form an equivalent lead line, which is substantially along a direction of data lines 3. Similarly, as illustrated FIG. 4, a plurality of connecting lines 5 are formed temporarily to electrically connect a set of pixel electrodes 1 to thereby form an equivalent lead line, which is substantially along a direction of gate lines 4.

In other words, a set of pixel electrodes 1 are electrically connected to one another by a set of connecting lines 5, and the set of pixel electrodes 1 are electrically integrated and thereby are equivalent to a lead line arranged in the array substrate.

Optionally and preferably, the plurality of connecting lines 5 and the plurality of first lead lines can be arranged at a substantially same layer, and therefore can be formed at a substantially same step during the manufacturing process of the array substrate. As such, the step S23 and the step S22 can be a same step in the method for manufacturing the array substrate disclosed herein.

Because there is no insulating layer arranged between the plurality of first lead lines and the plurality of pixel electrodes 1, a structure/pattern that is at a substantially same layer as the plurality of first lead lines, such as the plurality of connecting lines 5, can be fabricated directly at a substantially same step as the plurality of first lead lines to electrically connect the plurality of pixel electrodes 1.

As such, according to some embodiments of the method for manufacturing an array substrate, a metal layer for the formation of the plurality of first lead lines, such as a metal layer for the formation of a plurality of data lines or a metal layer for the formation of a plurality of gate lines, can be utilized for a simultaneous formation of the plurality of connecting lines 5. Thereby, the manufacturing process can be simplified and the manufacturing cost can be reduced.

Alternatively, according to some other embodiments of the method for manufacturing an array substrate, the plurality of connecting lines 5 and the plurality of pixel electrodes 1 are arranged at a substantially same layer and are manufactured at a substantially same step of the method. In other words, a transparent conductive layer used for manufacturing the plurality of pixel electrodes 1 can be utilized for a simultaneous formation of the plurality of connecting lines 5. The plurality of connecting lines 5 and the plurality of pixel electrodes 1 thereby substantially form an integrated structure for each corresponding set of pixel electrodes 1 electrically connected by each set of connecting lines 5, which substantially forms an equivalent lead line.

It is noted that the plurality of connecting lines 5 can be manufactured prior to, after, or during, the manufacturing process of the plurality of pixel electrodes 1 and the plurality of first lead lines, and as such, the plurality of connecting lines 5 can be manufactured at a substantially same step as another structure. For example, it is possible that if the plurality of first lead lines are a plurality of data lines 3, the plurality of connecting lines 5 can be manufactured at a substantially same step as the plurality of gate lines 4, and that if the plurality of first lead lines are a plurality of gate lines 4, the plurality of connecting lines 5 can be manufactured at a substantially same step as the plurality of date lines 3.

It is also possible that the plurality of connecting lines 5 can be manufactured in an independent or separate step (i.e. not at a substantially same step as other conductive patterns, such as a pattern of data lines, a pattern of gate lines, etc.).

It is further noted that according to some other embodiments of the method, the plurality of connecting lines 5 are not manufactured at a same step as the plurality of first lead lines or the plurality of pixel electrodes 1, and as such, an insulating layer can be arranged between the plurality of connecting lines 5 and the plurality of pixel electrodes 1, and a plurality of vias can be arranged in the insulating layer at positions which allow an electrical connection between each of the plurality of connecting lines 5 and two pixel electrodes 1.

According to some preferred embodiments of the disclosure, each of the plurality of connecting lines 5 can be arranged between two adjacent pixel electrodes 1 to electrically connect the two adjacent pixel electrodes 1. In other words, as illustrated in FIG. 3, one connecting line 5 is arranged between, and is thereby configured to electrically connect, two adjacent pixel electrodes 1 along the direction of data lines 3 (i.e. a vertical direction as illustrated in FIG. 3). As such, by means of a set of connecting lines 5, a corresponding set of pixel electrodes 1 can be electrically connected to thereby form an equivalent lead line as described above.

According to some other embodiments of the disclosure, the plurality of connecting lines 5 can be arranged in a manner different than the embodiments as described above. For example, each of the plurality of connecting lines 5 can be configured to run over multiple pixel electrodes to directly electrically connect these multiple pixel electrodes 1.

According to some embodiments, the plurality of pixel electrodes 1 are arranged in a matrix having rows and columns. Multiple pixel electrodes 1 are arranged along a first direction to substantially form rows or columns, i.e., the first direction is substantially a direction of rows or a direction of columns. Each of the plurality of first lead lines is configured to extend along the first direction and is disposed between two rows/columns of pixel electrodes 1. Optionally, a corresponding set of pixel electrodes 1 in a same row/column are electrically connected by a set of connecting lines 5 to thereby form an equivalent lead line.

In one embodiments of the disclosure as illustrated in FIG. 3, the plurality of pixel electrodes 1 are arranged in a matrix having rows and columns. The plurality of first lead lines are substantially a plurality of data lines 3 extending in a first direction (i.e. a direction of columns). Each first lead line (i.e. each data line 3) is arranged to extend along the first direction (i.e. the direction of columns), and is disposed between two adjacent columns of pixel electrodes 1. As such, a corresponding set of pixel electrodes 1 in a same column are electrically connected by a set of connecting lines 5 to thereby form an equivalent lead line.

In another embodiments of the disclosure as illustrated in FIG. 4, the plurality of pixel electrodes 1 are arranged in a matrix having rows and columns. The plurality of first lead lines are substantially a plurality of gate lines 4 extending in a first direction (i.e. a direction of rows). Each first lead line (i.e. each gate line 4) is arranged to extend along the first direction (i.e. the direction of rows), and is disposed between two adjacent rows of pixel electrodes 1. As such, a corresponding set of pixel electrodes 1 in a same row are electrically connected by a set of connecting lines 5 to thereby form an equivalent lead line.

In any of the embodiments as described above, each equivalent lead line formed by a same column of pixel electrodes 1 (as illustrated in FIG. 3) or by a same row of pixel electrodes 1 (as illustrated in FIG. 4) is in substantially parallel with, and thus does not cross with, any of the plurality of first lead lines (i.e. data lines 3 in FIG. 3, or gate lines 4 in FIG. 4). As such, each of the plurality of connecting lines 5 can be configured not to stagger with any of the plurality of first lead lines (i.e. an orthographic projection of each of the plurality of connecting lines 5 on the substrate 9 is not overlapped with any of the plurality of first lead lines on the substrate 9) to allow for an insulation between the plurality of connecting lines 5 and the plurality of first lead lines.

It is noted that besides the above embodiments, any of the equivalent lead lines can have a different configuration. For example, in cases where each of the plurality of first lead lines extends along a direction of rows, a set of pixel electrodes 1 of a same column can be configured to form an equivalent lead line. In another example, a set of pixel electrodes 1 from different rows or from different columns can form an equivalent lead line having a complicated configuration, such as a parallelly arranged configuration, or a bent configuration.

In any of the above embodiments, a connecting line 5 can be staggered with a first lead line (i.e. an orthographic projection of the connecting line 5 on the substrate 9 is overlapped with the first lead line on the substrate 9), and as such, the plurality of connecting lines 5 need to be configured such that they are not at a same layer of the plurality of first lead lines. As such, an insulating layer needs to be arranged between the plurality of connecting lines 5 and the plurality of first lead lines, and a plurality of vias need to be arranged in the insulating layer to realize electrical connections between each connecting line 5 and two corresponding pixel electrodes 1.

S24: Forming a first insulating layer 6 having a first via 61 and a second via, such that a connecting line 5 is arranged in the first via 61, and the first via 61 is arranged at a different position than the second via.

Herein, the first insulating layer 6 can be a gate insulating layer, a passivation layer, or a separate insulating layer, etc. The second via in the first insulating layer 6 can be a via for electrical connection between a pixel electrode 1 and a drain electrode of a thin-film transistor (TFT), or can be a via for electrical connection between a common electrode 2 and a common electrode line, etc. The first via 61 in the first insulating layer 6 is configured to facilitate a subsequent removal of the connecting lines 5 disposed therein.

There are multiple manners to form the first insulating layer 6 having the first via 61 and the second via.

According to some embodiments of the manufacturing method, a first via 61 is formed at a substantially same step as the second via. As such, the step S24 substantially comprises:

S241: Forming a first insulating layer 6 over the plurality of pixel electrodes 1 and the plurality of connecting lines 5; and S242: Forming a first via 61 and a second via in the first insulating layer 6.

Herein both the first via 61 and the second via can be formed in the first insulating layer 6 by means of a same etching process in the sub-step S242.

It is noted that in addition to this aforementioned embodiments (i.e. simultaneous formation of the first via 61 and the second via in the first insulating layer 6), it is possible to form the first via 61 in the first insulating layer 6 by means of a separate etching process (relatively to the formation of the second via) in a subsequent step, for example, in a step after testing of the array substrate.

Figure 7:
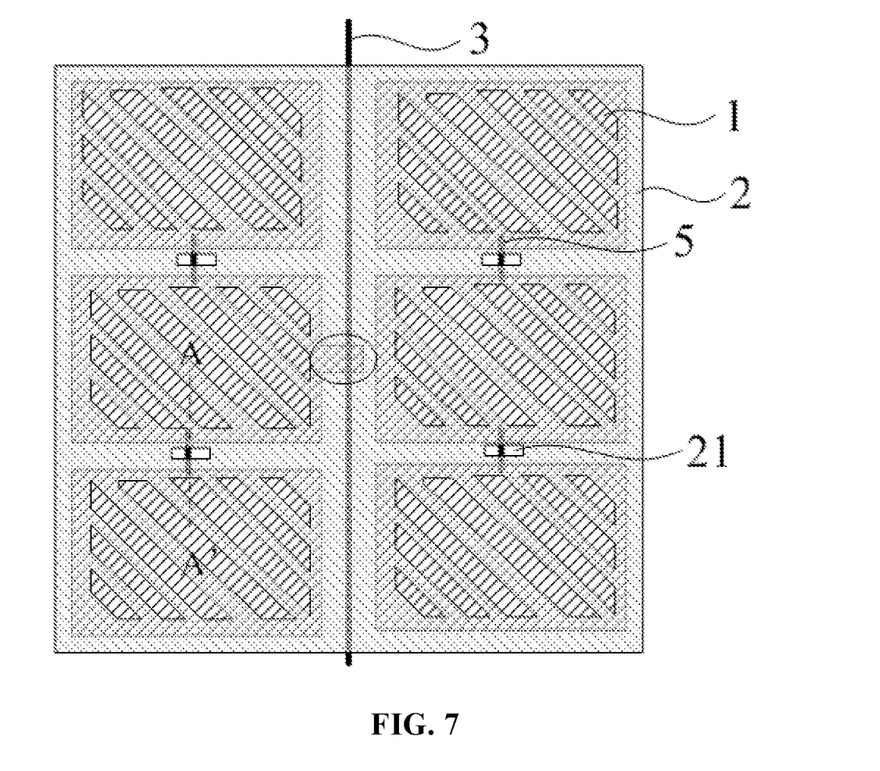
FIG. 7 illustrates a structural diagram of an array substrate being manufactured by a manufacturing method according to some embodiments of the disclosure after a common electrode having a plurality of openings has been formed.
Figure 8:
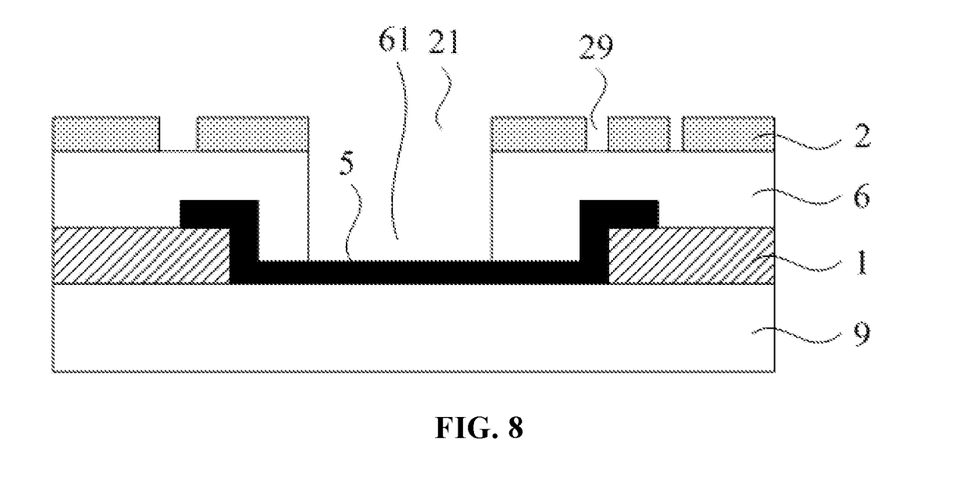
FIG. 8 is a cross-section view along a direction of A-A' of the array substrate being manufactured as shown in FIG. 7.

According to some embodiments of the disclosure, the array substrate manufactured by the method as disclosed herein is provided with a common electrode 2, as illustrated in FIG. 7 and FIG. 8. The common electrode 2 is configured to cover, or be stacked over the plurality of pixel electrodes 1, and an insulating layer (i.e. the first insulating layer 6) is disposed between the plurality of pixel electrodes 1 and the common electrode 2.

It is noted that the array substrate having the above configuration is substantially an array substrate having an ADS mode or an HADS mode, and it is further noted that in the array substrate having this above configuration, no insulating layer needs to be disposed between the plurality of pixel electrodes 1 and the plurality of first lead lines.

As such, according to some embodiments, after the formation of the first insulating layer 6 having the first via 61 and the second via in the step S24, the method for manufacturing an array substrate as disclosed herein can include a step S25, as following:

S25: Forming a common electrode 2 over the substrate 1 having the plurality of pixel electrodes 1 and the plurality of connecting lines 5, such that the common electrode 2 has a plurality of openings 21 corresponding respectively to the plurality of first vias 61 in the first insulating layer 6.

Herein the plurality of openings 21 in the common electrode 2 are configured to positionally correspond respectively to the plurality of first vias 6 in the first insulating layer 6, by having an orthographic projection thereof on the substrate 9 to be overlapped with an orthographic projection of the plurality of first vias 61 in the first insulating layer 6 on the substrate 9 (as shown in FIG. 8).

Since the plurality of first vias 61 in the first insulating layer 6 also positionally correspond to the plurality of connecting lines 5 (i.e. each connecting line 5 is arranged in one of the plurality of first vias 61), the plurality of openings 21 in the common electrode 2 also positionally correspond to the plurality of connecting lines 5 by having an orthographic projection thereof on the substrate 9 to be overlapped with an orthographic projection of the plurality of connecting lines 5, as illustrated in FIG. 7 and FIG. 8. As such, the configuration of the plurality of openings 21 in the common electrode 2 facilitates a subsequent removal of connecting lines 5.

In the array substrate manufactured thereby, the common electrode 1 is disposed over the plurality of pixel electrodes 1 (i.e. over a surface of the plurality of pixel electrodes 1 opposing to, or distal to, the substrate 9), as illustrated in FIG. 8. As such, the plurality of pixel electrodes 1 can substantially take a form of slit electrodes 29, and the common electrode 2 can substantially take a form of a plate-like electrode, as illustrated in FIG. 7 and FIG. 8.

It is noted that in addition to the above mentioned embodiments of the array substrate, a common electrode 2 can be formed prior to the formation of the plurality of pixel electrodes 1 (i.e. the plurality of pixel electrodes 1 are disposed over a surface of the common electrode 2 distal to the substrate 9, not shown in the drawings). As such, no openings need to be arranged in the common electrode 2. Optionally, an array substrate may contain no common electrode 2 (not shown in the drawings) at all, and as such the step S25 is not needed, too.

Further as illustrated in FIG. 7 and FIG. 8, in embodiments of the array substrate where the common electrode 1 is disposed over a surface of the plurality of pixel electrodes 1 distal to the substrate 9, the plurality of openings corresponding to the first vias 61 in the first insulating layer 6 (which in turn also correspond to the connecting lines 5) can be formed at a substantially same step as the formation of the common electrode 2. In other words, the common electrode 2 having the plurality of openings can be formed in a single step.

It is noted that in addition to this aforementioned embodiments (i.e. simultaneous formation of the plurality of openings in the common electrode 2), it is possible to form the plurality of openings 21 in the common electrode 2 by means of a separate etching process (relatively to the formation of the common electrode 2) in a subsequent step, for example, after the step of testing of the array substrate.

S26: Detecting whether any equivalent lead line is short circuited from a first lead line.

Herein, the step S26 can be performed by an array substrate detection process (i.e. array test) to detect whether any equivalent lead line is short circuited from a first lead line. Specifically, the step S26 can include:

S261: Inputting an electrical signal (i.e. testing signal) to each of the plurality of equivalent lead lines in a one-by-one order;

S262: testing whether any electrical signal (i.e. response signal) can be detected in any other of the plurality of first lead lines.

Herein the sub-step S261 of inputting an electrical signal to each of the plurality of equivalent lead lines in a one-by-one order can be performed through a probe attached to each of the plurality of equivalent lead lines.

If a response signal is detected in one first lead line, a short circuit occurs between the one first lead line from which the response signal is detected and the each of the plurality of equivalent lead lines from which a testing signal is inputted. In other words, a short circuit occurs between these two corresponding lead lines.

It is noted that in addition to the above embodiment of the step S26, where a testing signal is inputted to each of the plurality of equivalent lead lines in a one-by-one order, and a response signal is tested from a first lead line, it is possible to input a testing signal to each of the plurality of first lead lines in a one-by-one order, and a response signal is tested from an equivalent lead line through a probe connected thereto.

Herein, by means of the plurality of connecting lines 5, a corresponding set of pixel electrodes 1 are electrically connected by a set of connecting lines to form a lead line equivalent to a lead line which is supposedly insulated to one first lead line (i.e. an equivalent lead line). Yet if a short circuit occurs between the equivalent lead line and the one first lead line, due to the presence of a remain of pixel electrode, it is equivalent to a short circuit between these two corresponding lead lines, and thus can be detected by the array substrate detection process (i.e. array test).

Depending on the relationship between the equivalent lead line and the one first lead line, the short circuit can be equivalent to a gate line-gate line short circuit (GGS), a date line-date line short circuit (DDS), or a gate line-date line short circuit (GDS), etc.

It is noted that if a short circuit occurs between an equivalent lead line and one first lead line, it is actually caused by an electrical connection between one of the set of multiple pixel electrodes 1 and the one first lead line, which is substantially a remain of pixel electrode.

As such, by detecting if a short circuit occurs between an equivalent lead line and one first lead line, the remain of pixel electrode can be effectively detected, which can be further repaired to realize a successful interception of the defect, thereby the defect does not enter into a subsequent manufacturing process. In turn, an improved product quality and an increased qualification rate for the array substrate product can be realized as a consequence.

It is noted that in addition to an embodiment where the step S26 can be performed after each of the other structures of the array substrate are all formed in the manufacturing process, the step S26 can be performed in advance, as long as the plurality of pixel electrodes 1, the plurality of first lead lines, the plurality of connecting lines 5 have been formed. This latter embodiment has a simplified manufacturing process and a reduced manufacturing cost.

According to some embodiments of the disclosure, if a short circuit is detected between an equivalent lead line and a first lead line in the step S26, the method further comprises a step S27, specifically described in the following.

S27: Determining, if a short circuit is detected between an equivalent lead line and a first lead line, a position of a pixel electrode 1 in the equivalent lead line having a short circuited portion with the first lead line, and severing the short circuited portion of the pixel electrode 1 in the equivalent lead line.

Specifically, the step S27 can substantially comprise two sub-steps of:

S271: Locating, if a short circuit is detected between an equivalent lead line and a first lead line, a position of a pixel electrode 1 in the equivalent lead line having a short circuited portion with the first lead line; and S272: Severing the short circuited portion of the pixel electrode 1 in the equivalent lead line.

Figure 5:
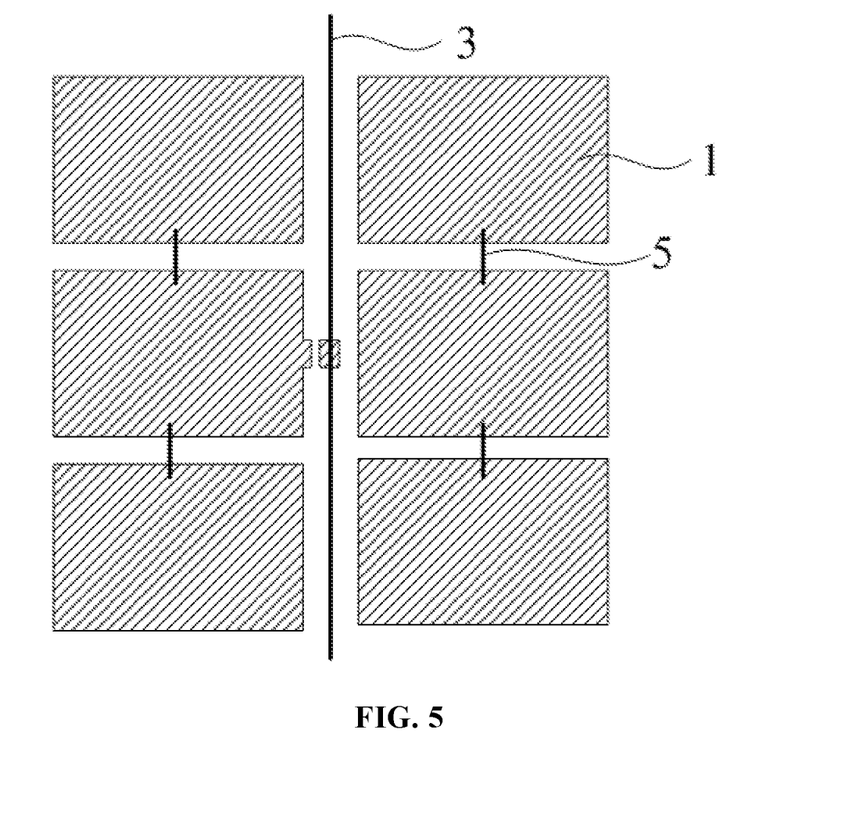
FIG. 5 illustrates an array substrate being manufactured by a manufacturing method according to some embodiments of the disclosure where a remain of pixel electrode is removed by cutting off.
Figure 9:
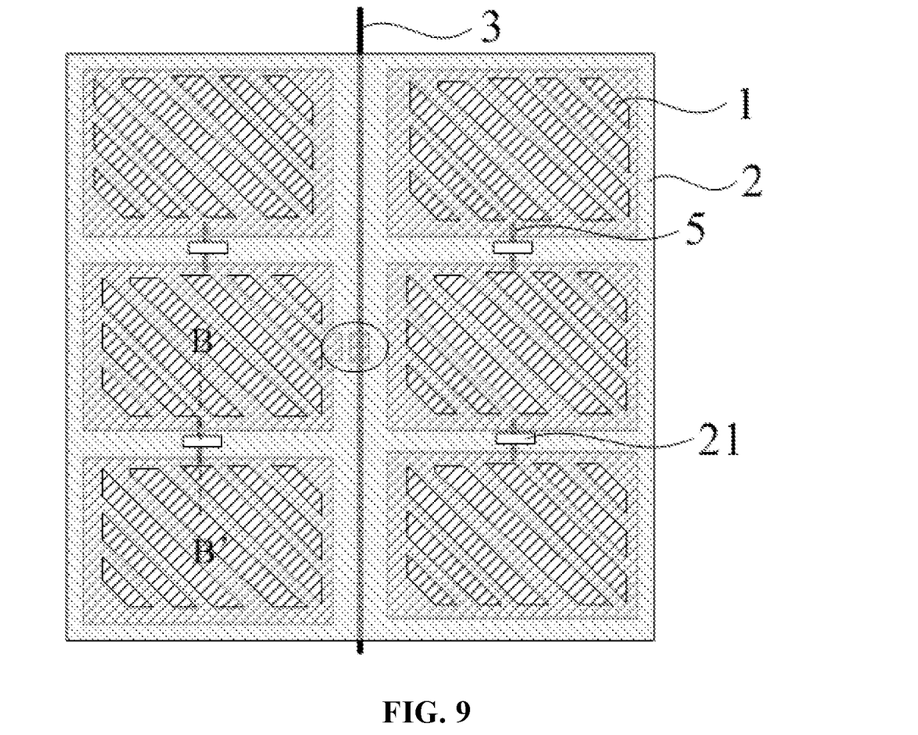
FIG. 9 illustrates a structural diagram of an array substrate being manufactured by a manufacturing method according to some embodiments of the disclosure after the plurality of connecting lines have been removed.
Figure 10:
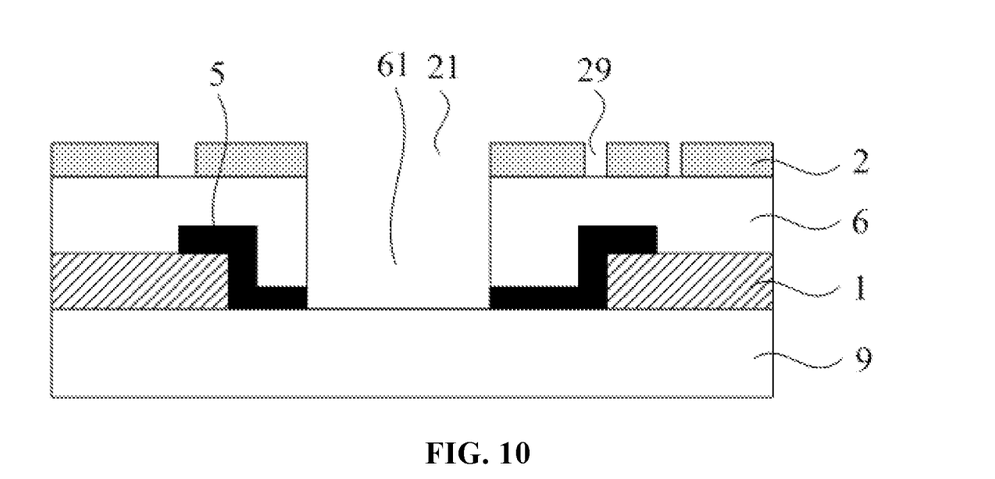
FIG. 10 is a cross-section view along a direction of B-B' of the array substrate being manufactured as shown in FIG. 9.

The above different sub-steps in the step S27 on the array substrate can be illustrated in FIG. 5, FIG. 9, and FIG. 10.

Herein the sub-step S271 of locating a position of the pixel electrode 1 in the equivalent lead line having a short circuited portion with the first lead line can be performed by microscopic observation and/or by signal analysis, which can be performed to specifically spot whether there is any physical contact between the pixel electrode 1 in the equivalent lead line with the first lead line. The physical contact is substantially a portion of the pixel electrode 1 in the equivalent lead line that forms a short circuit with the first lead line.

Herein, the sub-step S272 of severing the short circuited portion of the pixel electrode 1 in the equivalent lead line can be performed by a laser. By means of a laser cutting, the portion of the pixel electrode 1 in the equivalent lead line that forms a short circuit with the first lead line (i.e. the short circuited portion of the pixel electrode 1 in the equivalent lead line) can be severed or cut off to thereby realize an electrical disconnection/decoupling between the pixel electrode 1 in the equivalent lead line and the first lead line, consequently realizing a repair of the defect of the remain of pixel electrode.

It is noted that in addition to the above mentioned embodiment of the method where the localization and repair of a short circuited portion of a pixel electrode 1 in an equivalent lead line is performed during a manufacturing process of the array substrate, according to some other embodiments, the localization of a short circuited portion of a pixel electrode 1 in an equivalent lead line can be first determined in the manufacturing process of the array substrate, which can be repair in a subsequent step after the manufacturing of the array substrate, such as during a manufacturing of a display panel having the array substrate, or even after the display panel having the array substrate is manufactured.

S28: treating the plurality of connecting lines 5 such that any two pixel electrodes 1 are not electrically coupled.

Figure 6:
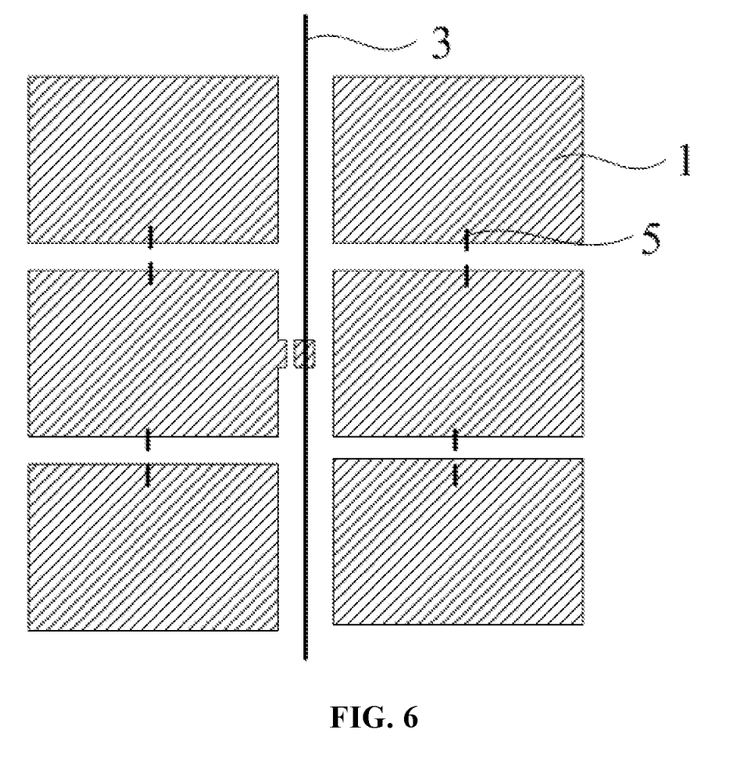
FIG. 6 illustrates an array substrate being manufactured by a manufacturing method according to some embodiments of the disclosure where a plurality of connecting lines are removed by severing.

The effect of the step S28 can be illustrated in FIG. 6, FIG. 9, and FIG. 10. As shown in the figures, at least some of the plurality of connecting lines 5 are treated to be severed or cut off to thereby realize an electric disconnection between any two pixel electrodes 1, which is needed to obtain a normally functioning array substrate project where the plurality of pixel electrodes 1 in the array substrate are configured to be insulated from one another.

It is noted that in addition to the above mentioned embodiment of the method, where the steps S28 (i.e. treating the plurality of connecting lines 5 such that any two pixel electrodes 1 are not electrically coupled) is after the step S27 (i.e. determining, if a short circuit is detected between an equivalent lead line and a first lead line, a position of a pixel electrode 1 in the equivalent lead line having a short circuited portion with the first lead line, and cutting off the short circuited portion of the pixel electrode 1 in the equivalent lead line), because the plurality of connecting lines 5 are required only during the detection process of a short circuit between any equivalent lead line and a first lead line (i.e. the step S26), and thus the step S28 can be performed before the step S27, as long as it is performed after the step S26.

Herein the step S28 of treating the plurality of connecting lines 5 such that any two adjacent pixel electrodes 1 are not electrically coupled substantially comprises removing at least a portion of each of the plurality of connecting lines 5 to realize an electrical disconnection between any two pixel electrodes 1.

According to some embodiments, the step S28 can be performed by means of an etching process, which is well known to those of ordinary skills in the field, and a description of the detailed process is skipped herein.

Because the etching process requires that each of the plurality of connecting lines 5 is exposed, in aforementioned embodiments where the array substrate comprises a first insulating layer 6 having a plurality of first vias 61 and a common electrode 2 having a plurality of openings 21 that positionally correspond to the plurality of first vias 61, the etching process can be performed to treat the plurality of connecting lines 5 to remove at least a portion of each of the plurality of connecting lines 5 to realize an electrical disconnection between any two pixel electrodes 1 through the plurality of openings 21 in the common electrode 2 and the plurality of first vias 61 in the first insulating layer 6.

In other embodiments where the array substrate comprises other structures above the plurality of connecting lines 5, these other structures need to be removed to expose the plurality of connecting lines 5 so as to allow the etching process to treat the plurality of connecting lines 5 to remove at least a portion of each of the plurality of connecting lines 5 to realize an electrical disconnection between any two pixel electrodes 1.

According to some other embodiments, the step S28 can be performed by means of a laser treating process. Other processes may be also possible.

Optionally, the at least a portion of each of the plurality of connecting lines 5 that is to be removed in the step S28 can include a portion between any two adjacent pixel electrodes 1. As such, depending on different embodiments of the method, only part, or all, of the portion of each of the plurality of connecting lines 5 between any two adjacent pixel electrodes 1 can be removed in the step S28.

In the array substrate as illustrated in FIG. 5 and FIG. 6, as well as in FIG. 9 and FIG. 10, where each connecting line 5 contains a portion that is disposed between two adjacent pixel electrodes 1, by performing the step S28, part of the portion of each connecting line 5 between two adjacent pixel electrodes 1 can be removed to realize an electrical disconnection among any pixel electrodes 1. This above way of performing the step S28 has an advantage of causing no influence on each of the plurality of pixel electrodes 1 in the array substrate.

It is noted that the manufacturing method of an array substrate also comprises steps of forming thin-film transistors, forming common electrode lines, and so on. These steps can be performed prior to, after, during, or in a substantially simultaneous manner as, any of the steps S21-28 as described above.

In another aspect, the present disclosure further provides an intermediate product of an array substrate during the method for manufacturing the array substrate.

The intermediate product of the array substrate comprises a plurality of first lead lines, a plurality of pixel electrodes, and a plurality of connecting lines.

The plurality of first lead lines and the plurality of pixel electrodes are over the substrate, and are configured such that an orthographic projection of the plurality of first lead lines on the substrate is not overlapped with an orthographic projection of the plurality of pixel electrodes on the substrate, and that no insulating layer is between a layer of the plurality of first lead lines and a layer of the plurality of pixel electrodes.

Each of the plurality of connecting lines is insulated from any one of the plurality of first lead lines, and is configured to electrically connect at least two of the plurality of pixel electrodes. It is further configured such that a set of pixel electrodes electrically connected by a set of connecting lines substantially form an equivalent lead line, and at least one end of each equivalent lead line is positioned at an edge of the array substrate.

The above mentioned intermediate product of the array substrate is produced during the manufacturing of the array substrate according to any one of the embodiments as described above. By detecting whether there is any short circuit between one equivalent lead line and one first lead line in the intermediate product of the array substrate, it can be determined whether there is a defect of a remain of pixel electrode in the array substrate, and if so, the defect can correspondingly be accurately positioned and effectively repaired.

After treating the plurality of connecting lines (i.e. removing at least a portion of each connecting line) to thereby realize an electrical disconnection between the plurality of pixel electrodes, an array substrate product having a normal function can be obtained, which can be further employed for the manufacturing of a display panel having the array substrate.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An intermediate product of an array substrate during a manufacturing process, comprising:
   a substrate; and
   a plurality of first lead lines, a plurality of pixel electrodes, and a plurality of connecting lines, over the substrate; wherein:
      each first lead line among the plurality of first lead lines is configured to be insulated from any one of the plurality of pixel electrodes;
      each connecting line among the plurality of connecting lines is configured to be insulated from any one of the plurality of first lead lines;
      each connecting line among the plurality of connecting lines is configured to electrically couple at least two among the plurality of pixel electrodes such that a set among the plurality of pixel electrodes electrically coupled by each set among the plurality of connecting lines substantially form an equivalent lead line; and
      the equivalent lead line is configured to form an equivalent short circuit with at least one of the plurality of first lead lines only when remains of at least one of the plurality of pixel electrodes cause electrical connection between least one of the plurality of pixel electrodes and the first lead line in order to facilitate detection and interception of the remains of the at least one of the plurality of pixel electrodes.

2. The intermediate product according to claim 1, wherein:
   there is no insulating layer between the plurality of first lead lines and the plurality of pixel electrodes; and
   an orthographic projection of the plurality of first lead lines on the substrate is not overlapped with an orthographic projection of the plurality of pixel electrodes on the substrate.

3. The intermediate product according to claim 2, wherein at least one end of each equivalent lead line is arranged at an edge of the array substrate.

4. The intermediate product according to claim 2, wherein each of the plurality of first lead lines is one of a data line or a gate line.

5. The intermediate product according to claim 4, wherein each connecting line is configured to electrically couple two adjacent pixel electrodes.

6. The intermediate product according to claim 2, further comprising:
   a first insulating layer over the plurality of first lead lines, the plurality of pixel electrodes and the plurality of connecting lines, wherein the first insulating layer is provided with a plurality of first vias, each configured to positionally correspond to, and to expose, each of the plurality of connecting lines; and
   a common electrode over the first insulating layer, wherein the common electrode is provided with a plurality of openings, configured to positionally correspond to the plurality of first vias in the first insulating layer respectively.

7. An array substrate, comprising:
   a substrate; and
   a plurality of first lead lines, a plurality of pixel electrodes, and a plurality of connecting lines, over the substrate; wherein:
      each first lead line among the plurality of first lead lines is configured to be insulated from any one of the plurality of pixel electrodes;
      each connecting line among the plurality of connecting lines is configured to be insulated from any one of the plurality of first lead lines;
      each connecting line among the plurality of connecting lines is configured to electrically couple at least two of the plurality of pixel electrodes such that a set among the plurality of pixel electrodes electrically coupled by each set among the plurality of connecting lines substantially form an equivalent lead line;
      no insulating layer is arranged between the plurality of first lead lines and the plurality of pixel electrodes;
      an orthographic projection of the plurality of first lead lines on the substrate is not overlapped with an orthographic projection of the plurality of pixel electrodes on the substrate; and
      the equivalent lead line is configured to form an equivalent short circuit with at least one of the plurality of first lead lines only when remains of at least one of the plurality of pixel electrodes cause electrical connection between least one of the plurality of pixel electrodes and the first lead line in order to facilitate detection and interception of the remains of the at least one of the plurality of pixel electrodes.

* * * * *